(12) United States Patent
Stobie et al.

(10) Patent No.: US 10,225,498 B2
(45) Date of Patent: Mar. 5, 2019

(54) PMOS/NMOS PIXEL DESIGN FOR NIGHT VISION IMAGING SENSOR

(71) Applicant: BAE SYSTEMS Information and Electronic Systems Integration Inc., Nashua, NH (US)

(72) Inventors: James A Stobie, Westford, MA (US); R Daniel McGrath, Lexington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/596,022

(22) Filed: May 16, 2017

(65) Prior Publication Data

US 2018/0338098 A1 Nov. 22, 2018

(51) Int. Cl.
| | |
|---|---|
| *H04N 5/361* | (2011.01) |
| *H04N 5/374* | (2011.01) |
| *H04N 5/378* | (2011.01) |
| *H04N 5/232* | (2006.01) |
| *H04N 5/33* | (2006.01) |
| *G02B 3/00* | (2006.01) |

(52) U.S. Cl.
CPC ........... *H04N 5/361* (2013.01); *G02B 3/0006* (2013.01); *H04N 5/23293* (2013.01); *H04N 5/33* (2013.01); *H04N 5/374* (2013.01); *H04N 5/378* (2013.01)

(58) Field of Classification Search
CPC ........ G02B 3/0006; H04N 5/361; H04N 5/33; H04N 5/23293; H04N 5/374; H04N 5/378
See application file for complete search history.

(56) References Cited

U.S. PATENT DOCUMENTS

| | | | | | |
|---|---|---|---|---|---|
| 5,898,196 | A | * | 4/1999 | Hook | H01L 27/14609 257/291 |
| 6,026,964 | A | * | 2/2000 | Hook | H01L 27/14609 257/236 |
| 7,791,114 | B2 | * | 9/2010 | Rhodes | H01L 27/14609 257/204 |
| 2006/0208285 | A1 | * | 9/2006 | Inoue | H01L 27/14603 257/239 |
| 2007/0108371 | A1 | * | 5/2007 | Stevens | H01L 27/14609 250/214.1 |
| 2007/0131992 | A1 | * | 6/2007 | Dosluoglu | H01L 27/14609 257/292 |
| 2008/0001192 | A1 | * | 1/2008 | Inoue | H01L 27/14603 257/291 |
| 2008/0179640 | A1 | * | 7/2008 | Chuang | H01L 27/14689 257/292 |
| 2008/0217723 | A1 | * | 9/2008 | Lauxtermann | H01L 27/14603 257/460 |
| 2008/0224191 | A1 | * | 9/2008 | Ahn | H01L 27/14609 257/292 |
| 2008/0251821 | A1 | * | 10/2008 | Ko | H01L 27/14609 257/292 |
| 2008/0283886 | A1 | * | 11/2008 | Hynecek | H01L 27/14603 257/292 |

(Continued)

*Primary Examiner* — Fazli Erdem

(74) *Attorney, Agent, or Firm* — Maine Cernota & Rardin; Scott J. Asmus

(57) ABSTRACT

An image sensor suitable for low light level imaging, the image sensor having a plurality of pixels, each pixel having nMOS and pMOS components, provides a lower noise threshold as compared to prior art single-flavor pixels.

13 Claims, 11 Drawing Sheets

(56) References Cited

U.S. PATENT DOCUMENTS

| | | | |
|---|---|---|---|
| 2009/0160971 A1* | 6/2009 | Jung | H01L 27/14603 348/229.1 |
| 2010/0148289 A1* | 6/2010 | McCarten | H01L 27/1463 257/432 |
| 2011/0062542 A1* | 3/2011 | Adkisson | H01L 27/14609 257/461 |
| 2012/0037789 A1* | 2/2012 | Tian | H01L 27/14603 250/208.1 |
| 2012/0050554 A1* | 3/2012 | Levine | H01L 27/14627 348/216.1 |
| 2013/0146747 A1* | 6/2013 | Hynecek | H01L 27/1464 250/208.1 |
| 2014/0167118 A1* | 6/2014 | Chang | H01L 27/14643 257/229 |
| 2015/0091114 A1* | 4/2015 | Mansoorian | H01L 27/14634 257/431 |
| 2015/0123173 A1* | 5/2015 | He | H01L 27/14634 257/231 |
| 2016/0150169 A1* | 5/2016 | Hynecek | H04N 5/374 348/308 |
| 2016/0286151 A1* | 9/2016 | Lahav | H04N 5/37452 |
| 2017/0241835 A1* | 8/2017 | Do | G01J 1/4228 |

\* cited by examiner

PMOS/NMOS PIXEL DESIGN FOR NIGHT VISION IMAGING SENSOR

FIELD

This disclosure relates to sensors, and more particularly, to imaging sensors that are particularly suited to low light applications.

BACKGROUND

Existing Complementary Metal-Oxide-Semiconductor (CMOS) imaging sensors (CIS) designed for low light level visible light and/or Near-Infrared (NIR) applications are typically limited in sensitivity by the shot noise on the detector's dark current and the thermal noise of the pixel source follower. These limitations stem from the design of the electronic circuits that make up the image sensors pixels themselves.

Current visible/NIR CIS pixels, which are almost exclusively silicon-based, utilize pinned photo-diodes (PPDs) and Field-Effect Transistors (FETs) to convert the light to electrical signals and perform in-pixel signal processing. These pixels have been either nMOS based utilizing a p-type substrate/well or pMOS based utilizing an n-type substrate/well. nMOS based pixels use n-channel metal-oxide semiconductors (nMOSFET, or nFET) and n-on-p substrate photo-diodes, or, less commonly and only more recently, pMOS based pixels use p-channel metal-oxide semiconductors (pMOSFET, or pFET) with p-on-n substrate photo-diodes. Neither solution, however, is ideal for obtaining the lowest possible noise.

These pixel designs are driven by the commercial imaging market, especially the market for small, high-megapixel imaging sensors, which are commonly used in mobile devices. The aforementioned markets place great emphasis on constructing ever smaller pixels, as opposed to pixels capable of collecting the most light and producing the least noise for low visible light applications. Unfortunately, such small sensors cannot afford the extra real estate required to implement a true CMOS pixel solution, i.e. one that contains both nMOS and pMOS components, forcing developers to choose between one of the two single-flavor pixel technologies. Unfortunately, either choice leads to pixels with high noise for low light level imaging applications.

More specifically, a pMOS pixel exhibits lower dark current (by a factor of 2-4) and therefore the shot noise associated with this dark current is also lower, compared to an nMOS pixel. The pMOS pixel source follower, however, has a lower mobility (⅓ to ¼) and lower transconductance as compared to an nFET follower. The transconductance refers to the gain of a FET, which is the ratio of the change in current at the output terminal to the change in voltage on the input gate. Transconductance can be increased by raising the operating current of the device. The thermal noise of a FET is inversely related to the square-root of its transconductance. As a consequence of these characteristics, a pFET source follower has relatively high thermal noise compared to an nFET source follower operating at the same current and power.

In comparison, nMOS-based pixels have lower thermal noise from the source follower but suffer from higher shot noise from increased dark current of the photo-diode. With these limitations in mind, neither an all pMOS nor an all nMOS, i.e. "single flavor", design can achieve both low dark current shot noise and low source follower thermal noise.

What is needed, therefore, is a pixel design that combines the benefits of each single-flavor designs to achieve lower noise and higher sensitivity. Preferably, such a solution would reduce the overall pixel noise by a factor of the square-root of 2 or more and improve the sensitivity of low light level/NIR CIS beyond those currently available.

SUMMARY

Night vision CIS designed for low light level visible/NIR imaging are limited in sensitivity by the shot noise on the detector's dark current and the pixel read noise, which is dominated by both thermal and 1/f noise of the pixel source follower. By lowering detector noise and pixel read noise the sensitivity and capability of night vision CIS is increased.

The general commercial market for such sensors, which is largely driven by the ubiquitous cell phone camera demand, has a similar goal but is subject to different constraints. Cell phone camera design is primarily driven by costs. To keep costs low, ever-increasing numbers of sensors are processed onto a given size wafer, which can only be accomplished by shrinking the size of the pixels themselves. The ubiquity of such sensors has led to large format devices using small pixel pitches, pixel pitch being the physical distance between the individual pixels. Today's pixel pitches are approaching 1 µm, forcing developers to choose between nMOS or pMOS pixel technology, with nMOS being the currently preferred technology.

In contrast, night vision image sensors typically have a pixel area 3-10 times larger than general purpose sensors of similar megapixel capability, i.e. a pixel pitch between 5 and 20 µm. This is done to ensure that at least a few photons are collected per pixel, even under very low light level conditions. The larger pixel provides sufficient space for both nMOS and pMOS based structures, allowing an optimum mix of nMOS and pMOS devices to fit in the unit cell, driving down noise without compromising signal. Lower noise high sensitivity pixels can be realized by incorporating both low dark current pMOS-based photodiodes with low noise nFET based pixel readout.

The approach disclosed herein has the benefit of reducing the sensitivity-limiting pixel noise of imaging sensors suitable for use in night vision devices by 40% or more, allowing users of such technology to see further into the night than ever before, with or without the supplemental use of near-infrared light sources.

One embodiment of the present disclosure provides a pixel with a n-type substrate with low dark current p-on-n substrate pin photo-diode, and P-channel FETs for the transfer and reset gates. The N-channel FET pixel source follower is fabricated in a Pwell.

Another embodiment of the present disclosure provides a pixel with a p-type substrate with the low dark current p-on-n pin photo-diode placed in a n-well with P-channel transfer and reset gates, and the N-channel source follower FET fabricated in the p-type substrate.

Another embodiment of the present disclosure provides a plurality of these CMOS pixels to produce an array of pixels with additional readout circuitry to control the operation and process the pixel information so that it can be further processed and transmitted off-chip.

One embodiment of the present disclosure provides an image sensor suitable for low light level imaging, the image sensor comprising: a plurality of pixels, wherein at least one pixel comprises: a p or n type substrate; at least one well of the opposite charge type of the substrate; a pMOS photo-detector fabricated in the n-type substrate or n-type well; and a plurality of silicon-based metal oxide semiconductor field effect transistors, wherein at least one transistor is a silicon-based p-type metal oxide semiconductor field effect transistor and at least one transistor is a silicon-based n-type metal oxide semiconductor field effect transistor and wherein at least one transistor is fabricated directly on the substrate and at least one transistor is fabricated within an opposite charge well.

Another embodiment of the present disclosure provides such an image sensor wherein at least one pixel further comprises a microlens configured to minimize signal loss.

A further embodiment of the present disclosure provides such an image sensor wherein each pixel further comprises a source follower in operative communication with the photodetector, wherein the source follower is an nFET source follower.

Yet another embodiment of the present disclosure provides such an image sensor wherein the pixel pitch of the image sensor is 5-20 µm.

A yet further embodiment of the present disclosure provides such an image sensor wherein the photodetector comprises a pinned photo diode.

Still another embodiment of the present disclosure provides such an image sensor further comprising a column bus line and a row-select transistor configured to allow the contents of the nFET source follower to be read.

A still further embodiment of the present disclosure provides such an image sensor further comprising an nFET pixel select switch.

One embodiment of the present disclosure provides an image sensor, the image sensor comprising: a plurality of pixels, wherein at least one pixel comprises: a photodetector configured to generate a photocurrent that varies based on the number of photons incident thereon; a transfer gate in operative communication with the photodetector and configured to allow a transfer of charge from the photodetector, which is generated, during use, by the impact of photons thereon; a floating diffusion node in operative communication with the transfer gate configured to store charge generated by the photodetector for later readout; a reset transistor in operative communication with the floating diffusion node configured to reset the potential of the floating diffusion node; and a source follower in operative communication with the floating diffusion node configured to monitor the potential of the floating diffusion node for readout by image sensor circuitry, wherein the photodetector, transfer gate, floating diffusion node, and reset gate are pMOS, affording low dark current and correspondingly low shot noise associated with this dark current, and the source follower is an nFET component, providing low thermal noise.

Another embodiment of the present disclosure provides such an image sensor wherein the pixel pitch of the image sensor is 5-20 µm.

A further embodiment of the present disclosure provides such an image sensor wherein at least one pixel further comprises a microlens.

Yet another embodiment of the present disclosure provides such an image sensor wherein the photodetector comprises a pinned photo diode.

A yet further embodiment of the present disclosure provides such an image sensor further comprising a column bus line and a row-select transistor configured to allow the contents of the nFET source follower to be read.

Still another embodiment of the present disclosure provides such an image sensor further comprising an nFET pixel select switch.

One embodiment of the present disclosure provides a night vision apparatus, the night vision apparatus comprising: at least one display; at least one image sensor, the at least one image sensor further comprising a plurality of pixels; wherein at least one of the plurality of pixels comprises: a photodetector configured to generate a photocurrent that varies based on the number of photons incident thereon; a transfer gate in operative communication with the photodetector and configured to allow a transfer of charge from the photodetector, which is generated, during use, by the impact of photons thereon; a floating diffusion node in operative communication with the transfer gate configured to store charge generated by the photodetector for later readout; a reset transistor in operative communication with the floating diffusion node configured to reset the potential of the floating diffusion node; and a source follower in operative communication with the floating diffusion node configured to monitor the potential of the floating diffusion node for readout by image sensor circuitry, wherein the photodetector, transfer gate, floating diffusion node, and reset gate are pMOS, affording low dark current and correspondingly low shot noise associated with this dark current, and the source follower is an nFET component, providing low thermal noise.

Another embodiment of the present disclosure provides such a night vision apparatus wherein the pixel pitch of the image sensor is 5-20 µm.

A further embodiment of the present disclosure provides such a night vision apparatus wherein at least one pixel further comprises a microlens.

Yet another embodiment of the present disclosure provides such a night vision apparatus wherein the photodetector comprises a pinned photo diode.

A yet further embodiment of the present disclosure provides such a night vision apparatus further comprising a column bus line and a row-select transistor configured to allow the contents of the source follower to be read.

Still another embodiment of the present disclosure provides such a night vision apparatus further comprising an nFET pixel select switch.

A still further embodiment of the present disclosure provides such a night vision apparatus further comprising a Pwell for the source follower and a row select gate, N+ implants for a source drain, and P+ implants for a Pwell tie.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Embodiments of the present disclosure reduce the noise inherent in Field Effect Transistors used in Complementary Metal Oxide Semiconductor (CMOS) image sensors, increasing their sensitivity. A FET (Field Effect Transistor) is a category of voltage-controlled device having an adjustable current carrying ability that is controlled by varying the strength of an applied electronic field.

Figure 1:
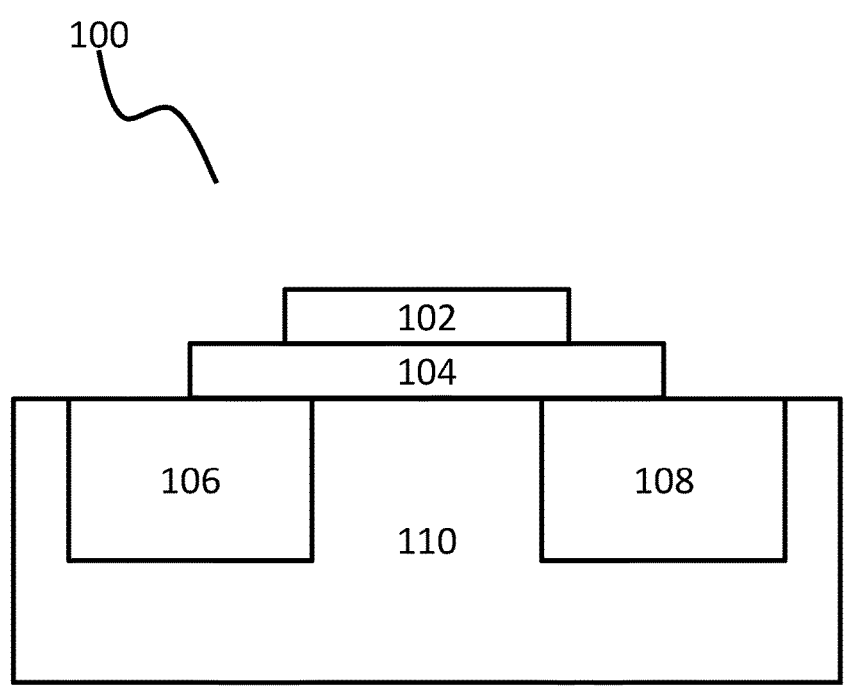
FIG. 1 is a block diagram illustrating a MOSFET comprising a gate, insulating layer, source, drain, and body, which may also be referred to as the substrate, configured in accordance with embodiments of the present disclosure.

Referring to FIG. 1, a commonly used FET, a Metal Oxide Semiconductor FET (MOSFET) 100, is shown. A MOSFET functions by inducing a conducting channel between two contacts (often referred to as the source 106 and the drain 108) by applying a voltage on an oxide-insulated 104 gate electrode 102 disposed between those contacts.

Figure 2:
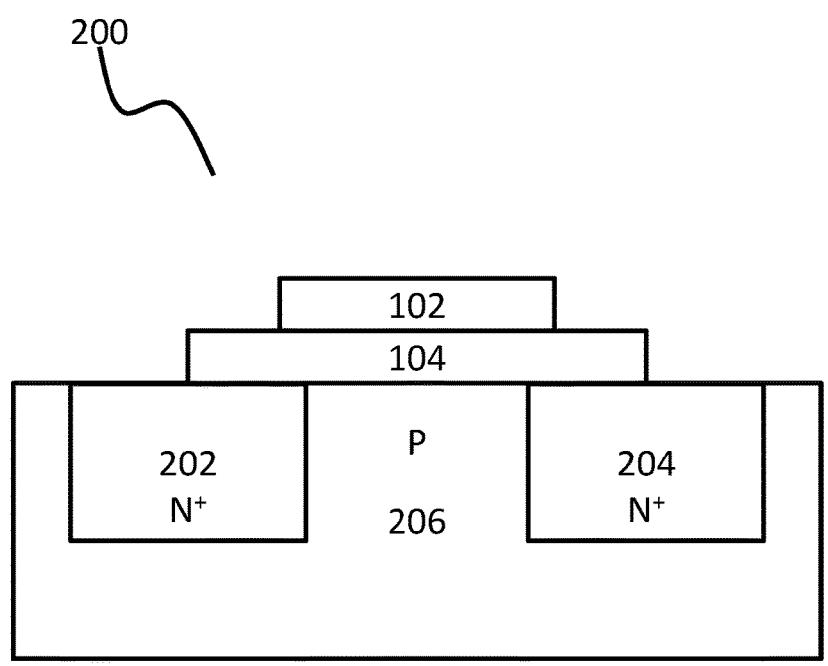
FIG. 2 is a block diagram illustrating an n-type MOSFET comprising a gate, insulating layer, source, drain, and body, which may also be referred to as the substrate, configured in accordance with embodiments of the present disclosure.
Figure 3:
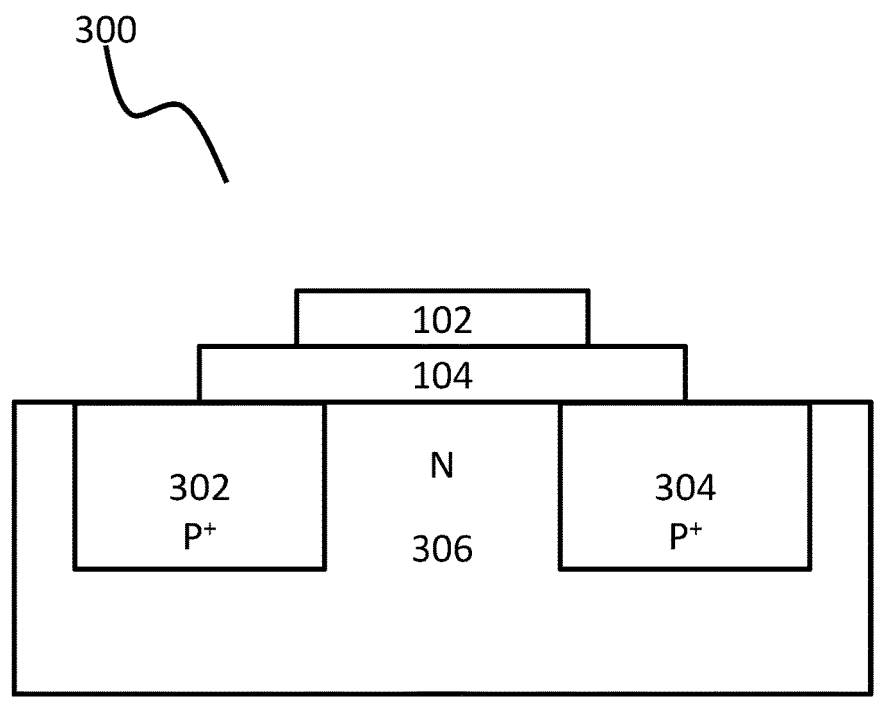
FIG. 3 is a block diagram illustrating a p-type MOSFET comprising a gate, source, drain, and body, which may also be referred to as the substrate, configured in accordance with embodiments of the present disclosure.

There are two main types of MOSFETs 100, with one called an n-channel MOSFET (herein referred to as an nFET) 200, shown in FIG. 2, and the other referred to as a p-channel MOSFET (herein referred to as a pFET) 300, shown in FIG. 3. The distinction between these MOSFETs 100 is the type of charge carriers that flow through the channel created in the body 110 of the device, which may also be referred to as the substrate, by the changeable electric field induced in the gate 102.

Referring to FIG. 2, nFET devices 200 are built with an n-type source 202, n-type drain 204 and a p-type substrate 206. In an nFET 200, the carriers are electrons. For nFET devices 200 the source 202 is biased below the drain 204 and the substrate 206 is typically biased at the source 202 potential or below. When a high voltage is applied to the gate 102 with respect to the source, the nFET 200 will conduct between source 202 and drain 204. When only a relatively low voltage is applied to the gate 102 with respect to the source 202, the nFET 200 will not conduct. More specifically, when a voltage is applied to the gate 102, which is separated from the p-type substrate 206 by an insulating layer 104, such as an oxide, holes in the p-type substrate 206 are driven away from the gate 102. This creates an n-type conduction channel between the source 202 and the drain 204, allowing a current to be carried by electrons therebetween.

Referring to FIG. 3, pFET devices 300 are built with a p-type source 302, p-type drain 304 and an n-type substrate 306. In a pFET 300, the charge carriers are holes. For pFET devices 300 the source 302 is biased above the drain 304, and the substrate is usually at the source 302 potential or above. When a voltage close to or above the source is applied to the gate 102, the pFET 300 will not conduct. When a low voltage with respect to the source 302 is applied to the gate 102, the pFET 300 will conduct. More specifically, when a positive voltage is applied between the source 302 and the gate 102 (negative voltage between gate 102 and source 302), a p-type conductance channel is formed between the source 302 and the drain 304. This allows a current to be carried by holes from the source 302 to the drain 304 through an induced p-type channel.

Figure 4:
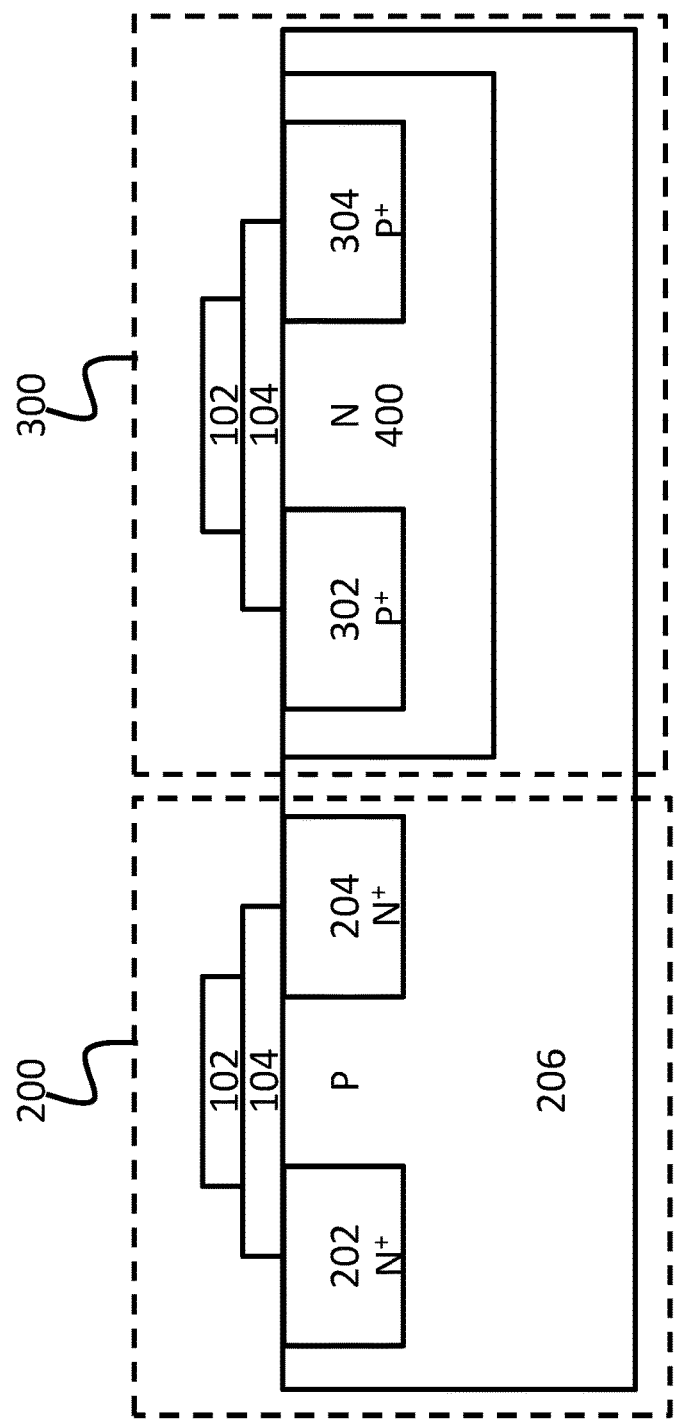
FIG. 4 is a block diagram illustrating a single substrate comprising both p-type and n-type MOSFETs, with the P-type MOSFET body relying on an Nwell embedded in the P-type substrate, configured in accordance with embodiments of the present disclosure.
Figure 5:
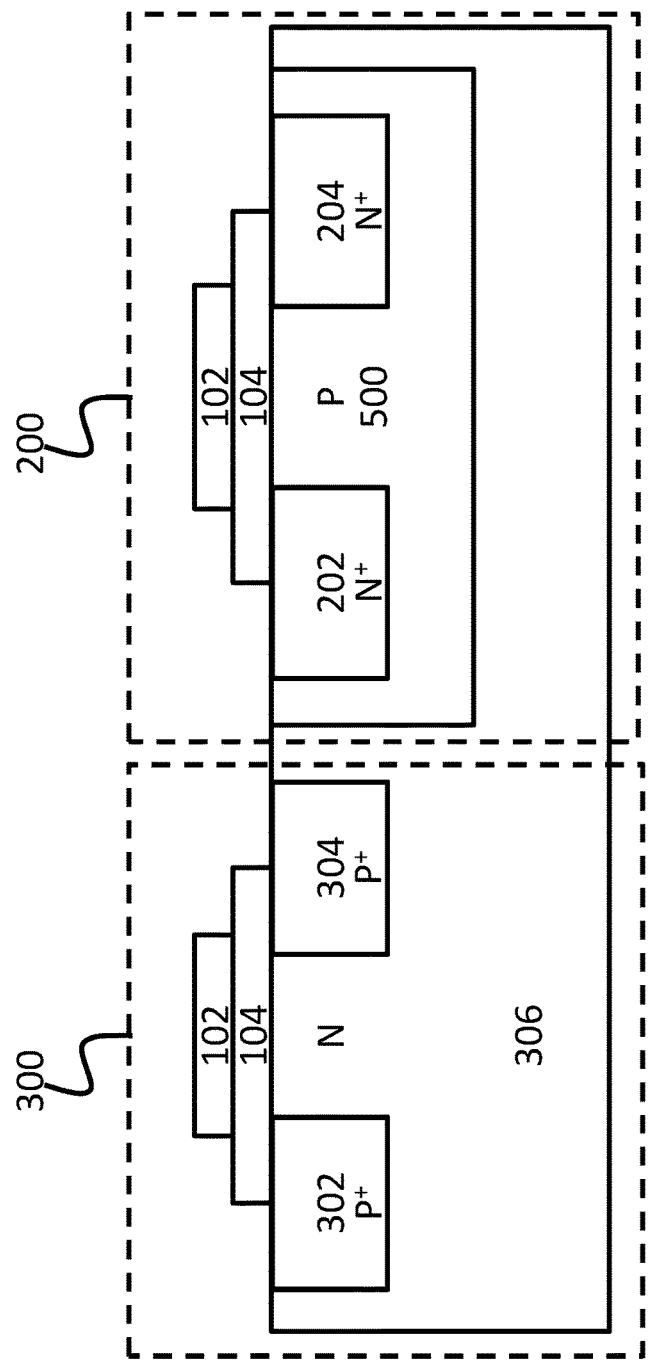
FIG. 5 is a block diagram illustrating a single substrate comprising both p-type and n-type MOSFETs, with the N-type MOSFET body relying on an Pwell embedded in the N-type substrate, configured in accordance with embodiments of the present disclosure.

As shown in FIGS. 4 and 5, it is possible to employ both types of MOSFETS 100 on a single substrate 110 by creating a well of the opposite charge doping in an area of the substrate 110 that is positioned under the MOSFET 100 of a different charge type.

FIG. 4 shows a single substrate having an nFET 200 and a pFET 300, where the substrate comprises a P-type substrate 206 and an Nwell 400. The Nwell 400 provides a negatively charged region between the p-type source 302 and p-type drain 304 that prevents a conductance channel from forming therebetween until a positive voltage is applied between the source 302 and the gate 102 (negative voltage between gate 102 and source 302), as previously described.

Similarly, FIG. 5 shows a single substrate with an nFET 200 and a pFET 300, where the substrate comprises an N-type substrate 306 and a Pwell 500. The Pwell 500 provides a positively charged region between the n-type source 202 and n-type drain 204 that prevents a conductance channel from forming therebetween until a voltage is applied to the gate 102, which causes holes in the p-type body 206 or substrate to be driven away from the gate 102. This creates an n-type conduction channel between the source 202 and the drain 204, as previously described.

Figure 6:
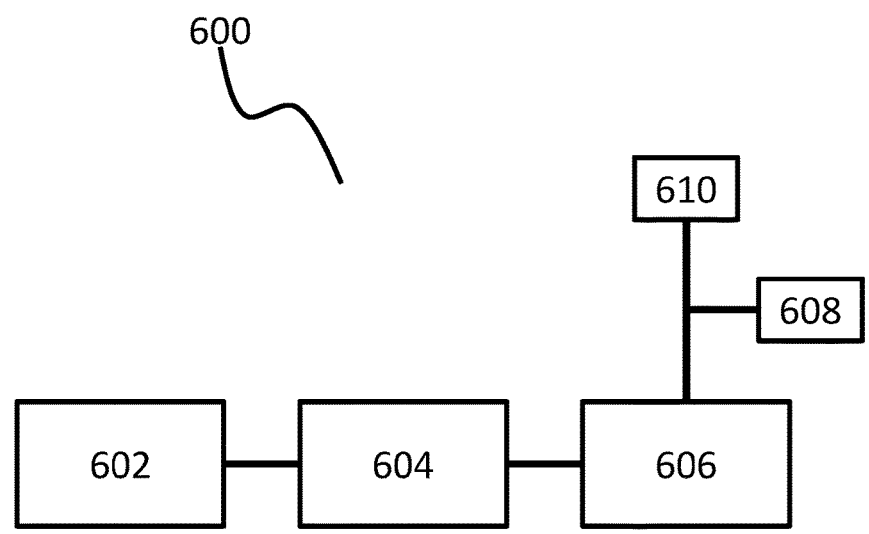
FIG. 6 is a block diagram showing the primary components of a pixel, configured in accordance with embodiments of the present disclosure.

Referring to FIG. 6, dark current is a term used to describe one of the main sources of noise in image sensors, such as the CMOS pixel shown in FIG. 6. Dark current is the relatively small electric current that flows through photosensitive devices, such as a photomultiplier tube, pinned photodiode (PPD), or CCD, even when no photons are entering the device. Such devices may also be referred to, generally, as photodetectors 602. Dark current consists of the charges generated in the photodetector 602 when no outside radiation is entering. Physically, dark current is due to the random generation of electrons and holes within and near the depletion region of the device, i.e. the area between source 106/202/302 and drain 108/204/304 shown in earlier figures. Although, in some instances, the pattern of different dark currents can result in a fixed-pattern noise, which can be partially removed through dark frame subtraction (removal of an estimate of the mean fixed pattern), this technique is not wholly effective as there still remains a temporal noise, which is due to the dark current itself having a shot noise.

Shot noise or Poisson noise is another type of electronic noise present in circuits such as that shown in FIG. 6. Shot noise originates from the discrete nature of electric charge and, in optical devices, is associated with the particle nature of light. Shot noise exists in optical devices because light consists of the movement of discrete (i.e. quantized) 'packets'.

Shot noise may be dominant when the finite number of particles that carry energy (such as electrons in an electronic circuit or photons in an optical device) is sufficiently small so that uncertainties due to the Poisson distribution, which describes the occurrence of independent random events, are of significance. Reducing this type of noise is of particular importance in maximizing the sensitivity of optical sensors configured for low visible light level applications, due to the relatively low number of photons incident on such sensors during their intended use.

1/f noise, or "pink" noise, is a signal or process with a frequency spectrum such that the power spectral density (energy or power per frequency interval) is inversely proportional to the frequency of the signal. A simple expression for the 1/f noise is:

$$E_{n1/f} = E_{n1/f}(1\ Hz)/f^\beta, \text{ with units of } \{V/rt(Hz);$$

where,

En1/f (1 Hz) is the 1/f noise component at 1 Hz, and
β is the 1/f exponential coefficient, which is usually around 0.5.

The frequency point at which the 1/f noise meets the flat band noise is referred to as the 1/f knee. Correlated double sampling further reduces the 1/f noise contributions by differencing two samples close in time creating a high-pass filter. Correlated double sampling is usually performed to remove the offset variation that occurs each time the pixel floating diffusion is reset. This CDS operation also increases the flat band noise by square-root of two, as a result of the double sampling process. At higher frequencies, i.e. those above the 1/f knee, the noise spectral density becomes limited by the thermal noise of the FET, which is independent of frequency until it becomes band limited, in practice at high frequencies. This thermal noise, Vn, can be represented by $$Vn^2 = 8/3 * kT/(gm + gds + gmb);$$

where, k=Boltzmann Constant;
T=Temperature of the sensor;
gm=Gate 102 to source 106/202/302 transconductance of the MOSFET 100/200/300;
gds=The drain 108/204/304 to source 106/202/302 transconductance of the MOSFET 100/200/300; and
gmb=The backgate, or bulk 110/206/306, transconductance of the MOSFET 100/200/300.

Thermal noise also affects the sensitivity of pixels 600, such as that shown in FIG. 6. Thermal noise, generally speaking, is the electronic noise generated by the thermal agitation of charge carriers inside of an electrical conductor at equilibrium. It may also be referred to as Johnson-Nyquist noise, Johnson noise, or Nyquist noise. Thermal noise variance (Vn²) is proportional to one over the square-root of the mobility.

Thermal noise varies with the temperature and transconductance of the device, which is a function of its geometrical design, operating current, and process parameters. The dominant transconductance term is usually gm, which for above saturation can be expressed as:

$$gm = sqrt(2u_x C_{0x} * W/L * I_D);$$

where $u_x$ is the carrier mobility for the MOSFET 100/200/300;
W is the channel width under the gate 102;
L is the channel length under the gate 102 from source 106/202/302 to drain 108/204/304; and
$I_D$ is the drain 108/204/304 to source 106/202/302 current passing through the device.

Referring to FIG. 6, a pixel 600 configured in accordance with embodiments of the present disclosure is shown. The pixel 600, in embodiments, is one of many that are combined, in embodiments in a grid formation having rows and columns, to create a CMOS image sensor, wherein each pixel 600 measures the light incident thereon.

Figure 9:
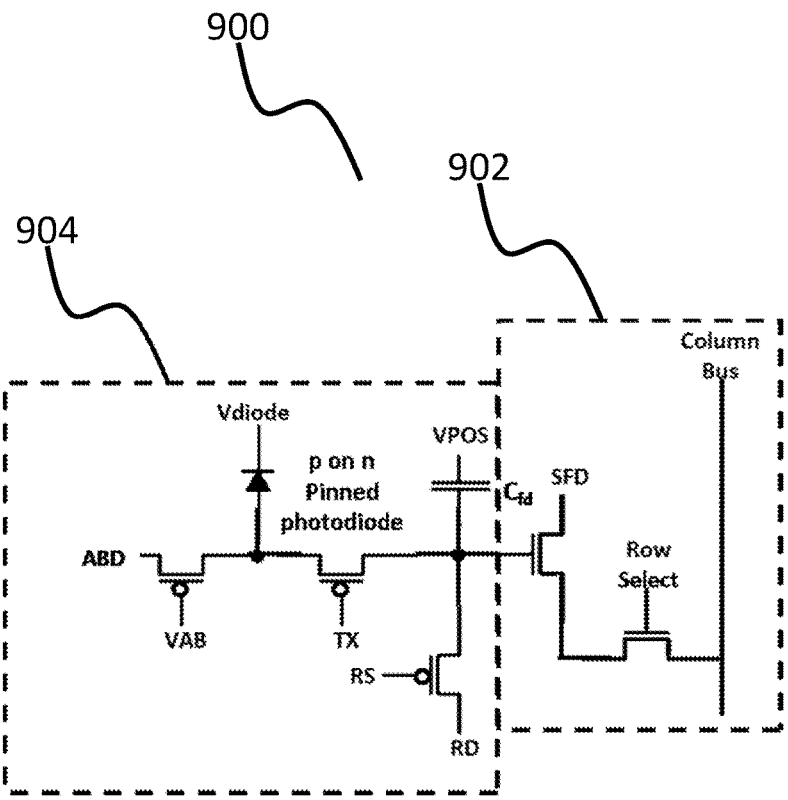
FIG. 9 is a schematic of a CMOS pixel, comprising both nMOS and pMOS components, configured in accordance with embodiments of the present disclosure.

In embodiments, such as that shown in FIG. 6, each pixel 600 comprises a photodetector 602, which may be a PPD, a transfer gate 604, a floating diffusion (FD) node 606, a source follower (SF) 608, and a reset gate 610, which is connected to the larger image sensor by circuitry that allows the value of each pixel 600 to be read by its position, i.e. column and row, thereon. More specifically, signal charge collected by the pixel 600 photodetector 602 is transferred through a transfer gate 602 to an FD node 606 whose potential is monitored by the source follower 608, which may also be referred to as a common-drain amplifier, within the pixel 600. In embodiments, prior to a transfer the FD 606 is reset by a transistor reset signal (RST), provided by the reset gate 610. The source follower 608 is connected to circuitry allowing the contents thereof to be read, which, in embodiments, may comprise a column bus line (COL BUS) using a row-select transistor (SEL). Where elements of the pixel 600 utilize both nFET 200 and pFET 300 architectures, a CMOS pixel 900, as shown in FIG. 9, is created.

Figure 7:
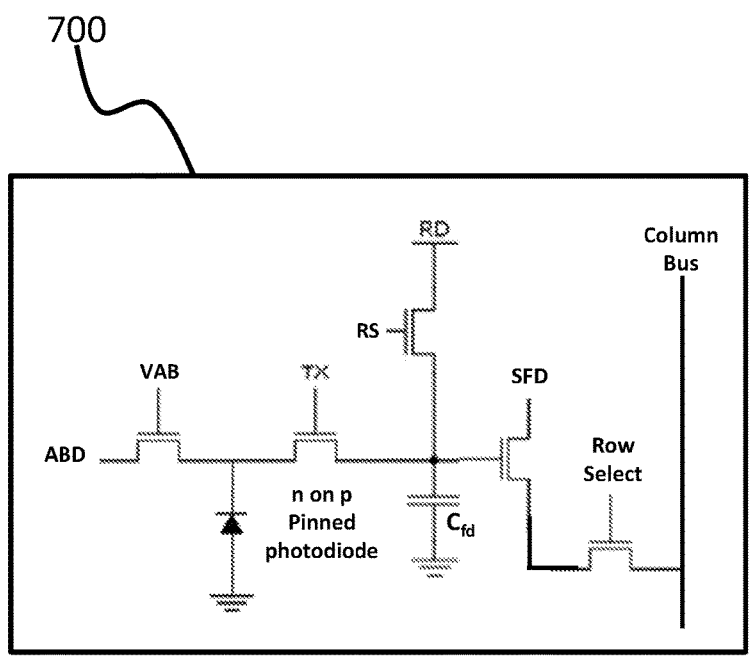
FIG. 7 is a schematic of an exclusively nMOS pixel.
Figure 8:
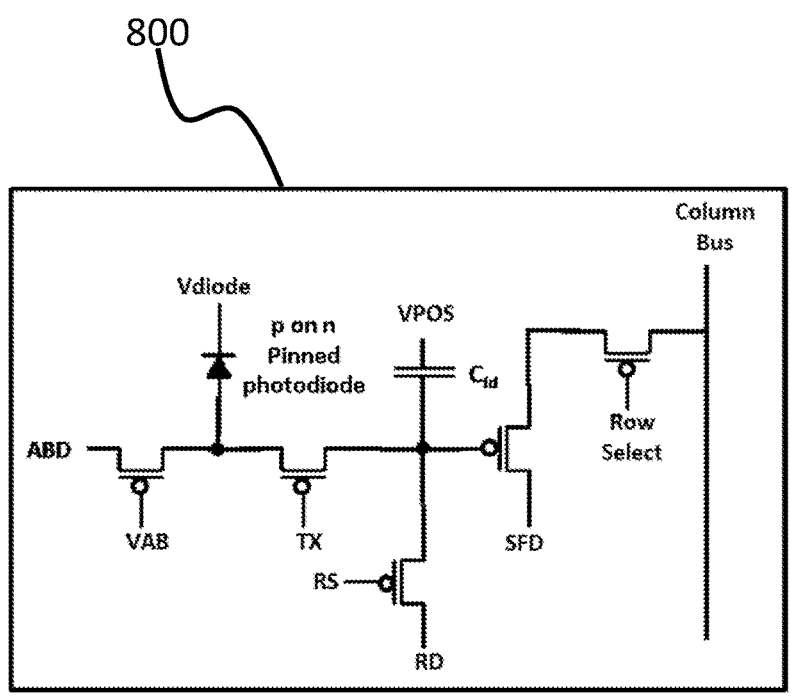
FIG. 8 is a schematic of an exclusively pMOS pixel.

Referring to FIGS. 7 and 8, current visible light sensors have pixels 600 that are either entirely pMOS (pFET 300 and pMOS photo-diode) or nMOS (nFET 200 and nMOS photo-diode) based. Such an entirely nMOS based pixel 700 is shown in FIG. 7. An entirely pMOS based pixel 800 is shown in FIG. 8. The prevalence of singular process pixels 600 is largely driven by the commercial imaging market's requirement for ever smaller pixels 600 to allow for the production of compact, high-megapixel devices. Unfortunately, neither solution is ideal for obtaining the lowest possible noise, which is especially important for low light level sensors suitable for starlight and below sensing, such as those used in night-vision equipment.

Neither choice is ideal because either option results in relatively high noise, and thus limited sensitivity, when configured for low light level imaging applications. Specifically, the photodetector 602 of pMOS pixels 800 exhibits lower dark current by a factor of 2 to 6 and lower shot noise, which may also be referred to as Poisson noise, associated with this dark current compared to that of nMOS pixels 700. In such an all pMOS sensor design, however, the pixel 800 pFET 300 source follower 608 has lower mobility of charge carriers, about ⅓ to ⅕ that of an nFET 200 source follower 608, and lower transconductance (the relationship of the current through the output of a device to the voltage across the input of a device, i.e. the opposite of resistance, which may also be referred to as mutual conductance) as well. As a consequence, a pFET 300 source follower 608 has higher thermal noise, as compared to an nFET 200 source follower 608.

On the other hand, nMOS pixels 700 have lower thermal noise resulting from the source follower 608, but suffer from higher shot noise from the dark current. This is due to hole mobility for pFET 300 devices being 3 to 5 times lower than the electron mobility for nFET 200 devices. Specifically, this difference leads to a 1.7 to 2.2 times lower noise for an equivalent size nFET 200 devices operating at the same power as a pFET 300 device.

To achieve nFET 200 equivalent thermal noise in pFET 300 pixels 800, their source follower 608 size and/or the power dissipated through the pixel 800 would need to be increased significantly. For a pFET 300 device to achieve the same thermal noise as an nFET 200 circuit, its width to length ratio would have to grow by a factor of 3 to 5 times to compensate for the difference in mobility, or its power would need to increase by a minimum factor proportional to the mobility difference. Neither of these approaches is desirable for a variety of reasons. For instance, larger MOSFETs 100/200/300 will negatively impact floating diffusion capacitance and conversion efficiency of photons in to voltage change at the floating diffusion, and increased power is not conducive to battery operated sensors. With these limitations in mind, neither type of single-flavor pixel 700/800 produced today can practically achieve both low dark current shot noise and low source follower 608 thermal noise. A CMOS architecture, however, configured in accordance with embodiments of the present disclosure, can provide such benefits.

Figure 10:
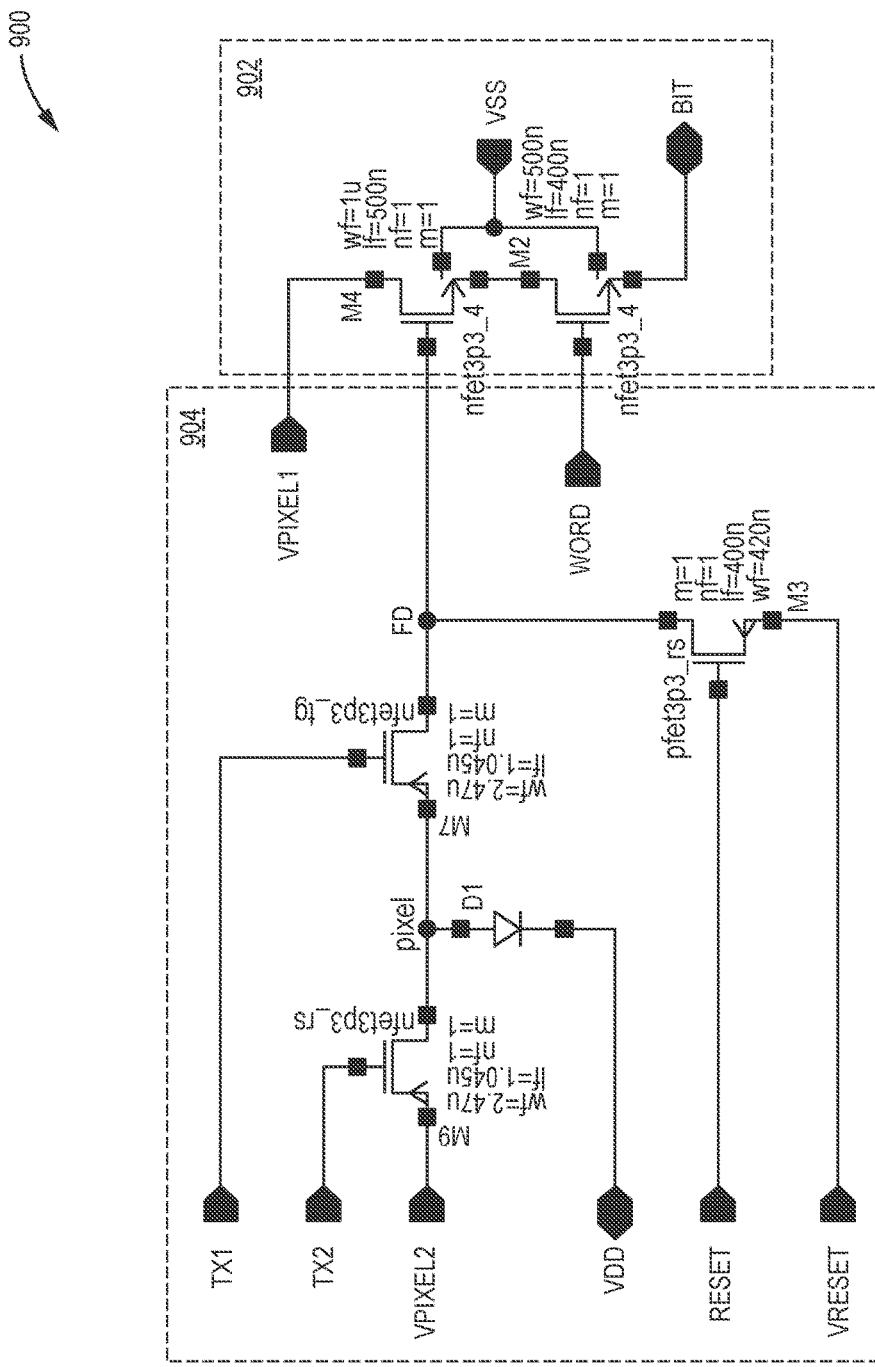
FIG. 10 is a schematic of a CMOS pixel, comprising both nMOS and pMOS components, configured in accordance with embodiments of the present disclosure.
Figure 11:
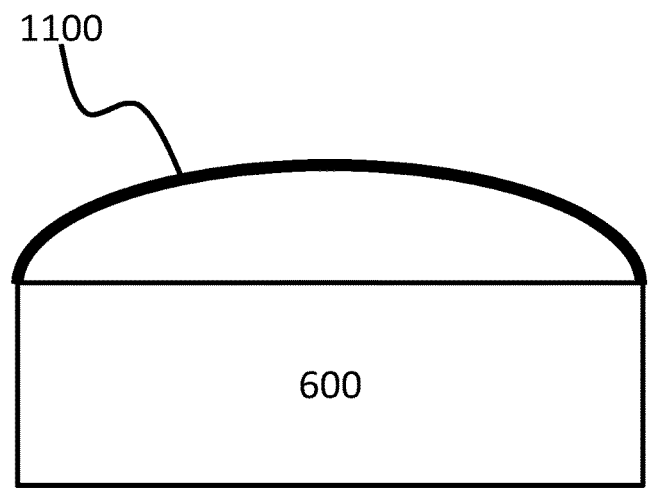
FIG. 11 is a side view of a microlens, configured in accordance with embodiments of the present disclosure.

Referring to FIGS. 9 and 10, which show CMOS pixels 900 configured in accordance with embodiments of the present disclosure, relevant design considerations for CMOS pixels 900 include noise, fill factor (the ratio of a CMOS pixel's 900 light sensitive area to its total area), collection efficiency with microlenses 1100, shown in FIG. 11, full well capacity (the maximum number of photon impacts on a CMOS pixel 900 that may be recorded between readouts) and lag. Low noise night vision CMOS pixels 900 also require very low 1/f noise in the source follower 608 driver MOSFETs 100/200/300. Once the 1/f noise is eliminated, or at least substantially reduced using correlated double sampling techniques, the noise threshold becomes limited by the thermal noise of the driver MOSFET 100/200/300. This noise varies inversely with the square-root of the carrier mobility in the MOSFET 100/200/300 channel. An nFET 200 architecture has historically shown a 2 to 4 times higher carrier mobility than pFET 300 designs. This leads to nFET 200 source followers 608 having 70 percent or lower thermal noise than is possible with and equivalent size pFET 300 devices operating at the same power levels.

Important to implementation of embodiments of the present disclosure, night vision CMOS image sensors, in contrast to those that are typically used in other commercial devices (e.g. cell phone cameras), have relatively large individual pixels 600. While most commercial devices have a pixel pitch of between 1-3 µm, night vision sensors often use a pixel pitch of between 5-20 µm. This is done to allow the pixel 600, which, in embodiments of the present disclosure, is a CMOS pixel 900 to collect as many photons as possible, which is of great importance when such photons are scarce, such as in the very low light level conditions in which night vision devices are intended to operate.

Also, night vision CIS designed for low light level visible/NIR imaging are typically limited in sensitivity by the shot noise on the detector's dark current and the thermal noise of the source follower 608. This is generally true for well-designed sensors using mature processes that have minimal 1/f noise in the pixel 600 MOSFETs 100/200/300. However, in accordance with embodiments of the present disclosure, a CMOS pixel 900 combines the benefits of both pMOS (pFET 300 and photo-diode) and nFET 200 elements, lowering both noise terms and resulting in such a CMOS pixel 900 having lower noise by at least a factor of the square-root of 2 as compared to single-flavor pixels 700/800.

With these differences in mind, Low Light Level (LLL) imaging sensors provide an opportunity to depart from the singular-flavor pixel 700/800 paradigm. With larger pixels 600 (5-20 µm v. 1-3 µm) it is possible to consider alternatives to the singular pixel 700/800 process to achieve lower noise performance. This is, at least in part, because the physical separation required between pMOS and nMOS regions to ensure their isolation can be accommodated within the low light level CMOS pixel 900 without sacrificing excessive fill factor. In embodiments having a relatively small CMOS pixel 900 pitch, i.e. one at the lower end of the 5-20 µm range, the impact of any sacrifice in fill factor, can be lessened through the use of a microlens 1100, as shown in FIG. 11, which allows for the focusing of light incident on substantially all of the CMOS pixel's 900 total area to its light-sensitive area. A microlens 1100, in embodiments, is configured to cover substantially the entire CMOS pixel 900, including both nFET 200 and pFET 300 portions thereof, and to focus light incident thereon onto the photosensitive portion thereof. With both flavors possible in such a CMOS pixel 900, an optimum low noise CMOS pixel 900 can be realized.

The benefits of a true CMOS pixel 900, i.e. one having both pFET 300, pMOS photo-diode and nFET 200 components, becomes possible by introducing an additional well, which may be an Nwell 400 or a Pwell 500, into the CMOS pixel 900 input cell. With both flavors available in the CMOS pixel 900, an optimum low noise pixel can be realized.

Referring again to FIGS. 9 and 10, the aforementioned pMOS dark current advantage is leveraged in one embodiment of the present disclosure to produce a true CMOS low light pixel 900 design having a pMOS portion 904 comprising a pinned photodiode 602 and pFET transfer and reset gates, and an nFET portion 902 comprising a source follower 608. In simulation of such a design, negligible signal loss was identified using such a true CMOS pixel 900 having a pixel pitch of 8.5 um.

The only downside of such a configuration noted during simulation was that a portion of the linear charge capacity range of the CMOS pixel 900 was reduced to 60 percent of the available range for a single-flavor pixel. This is because, for a pMOS pixel 800, the floating diffusion node 606 of embodiments can be reset as low as 0.5V and can integrate detector charge up to 1.8V, which is the photodetector 602 zero-charge voltage of embodiments, to provide a 1.3V range. An nMOS pixel 700 with both an nFET 200 source follower 608 and an nMOS 200 photodetector 602 can reset the floating diffusion node 606 to 2.8V and integrate down to the 1.5V zero-charge potential of the photodetector 602, also providing a 1.3V range. A CMOS pixel 900, however, with both a pMOS portion 904 comprising a photodetector 602 and an nFET portion 902 comprising a source follower 608 must start with the floating diffusion node 606 reset to 1 volt and integrate up to 1.8V, providing only 0.8V of linear range, which represents the 60 percent reduction in charge capacity referenced above. This loss in charge capacity, however, is more than offset by the reduction in noise threshold of the design, which allows such a CMOS pixel 900 to achieve a similar or better linear dynamic range relative to single-flavor pixels 600.

Referring again to FIGS. 9 and 10, a CMOS pixel 900, configured in accordance with embodiments of the present disclosure, is shown. This embodiment makes use of a pMOS 904 and an nFET 902 region to leverage the advantages and mitigate the drawbacks of each, resulting in high sensitivity, as compared to prior art designs, that is particularly useful for low visible light level imaging.

Now referring to FIG. 10, a CMOS pixel 900, configured in accordance with embodiments of the present disclosure, is shown. This embodiment also makes use of a pMOS region 904 and an nFET region 902 to leverage the advantages and mitigate the drawbacks of each, resulting in a CMOS pixel 900 having characteristics useful for low visible light level imaging.

In embodiments, a pMOS pinned photodiode 602, pFET 300 transfer gate 604, FD node 606 and reset gate 610 affords low dark current and correspondingly low shot noise associated with this dark current. The signal charge placed on the FD node 606 of such an embodiment can then be read out of the CMOS pixel 900 as voltage change using an nFET 200 source follower 608, which affords higher mobility than a pFET 300 source follower 608 and hence lower thermal noise, by a factor of 1.7 to 2.2, for the same size device and power dissipation.

Referring to FIG. 11, a microlens 1100, is shown. A microlens 1100 is a small lens, generally having a diameter less than a millimeter (mm) and often as small as a few micrometers (μm). Such lenses 1100 are used to focus light incident on a pixel 600 onto the photosensitive area of the pixel 600, which is typically the photodetector 602, thus reducing the chance that light incident on the sensor package will be wasted while allowing for pixel 600 designs that do not maximize the sensing area of an individual pixel 600 to be viable.

In one embodiment, an 8.5 μm pixel pitch CMOS pixel 900 containing a pMOS PPD 602 with an optimized nFET 200 source follower 608 is used. While providing certain benefits, this CMOS pixel 900 design does impact the charge capacity, reducing it to 60 percent of what is possible with a single flavor unit cell. The drop in charge capacity is, however, met with an even larger drop in pixel 600 noise, with the end result being that sensitivity is increased without adversely affecting the linear dynamic range of the CMOS pixel 900. The pMOS PPD 602 of such an embodiment reduces the dark current noise by at least a square-root of two and adds process margin over what is possible with nMOS PPDs 602. The use of an nFET 200 source follower 608 with low 1/f noise lowers the total noise by a factor of at least 2, without losing signal over what is possible with pFET 300 alone.

In embodiments, components of an individual CMOS pixel 900 include one or more of the following: PPDs 602, poly-silicon gates, anti-blooming gates, transfer gates 604, reset gates 610, and source followers 608. Embodiments also comprise both Pwells 500 and/or Nwells 400, which allow for nFET 200 to exist on a P-type body 206 or substrate and pFET 300 and pMOS photo-diodes to exist on an N-Type body 306 or substrate, respectively.

In embodiments, the configuration of CMOS pixel 900 elements results in a reduction in the exposed photo sensitive region of the pixel. In such embodiments, microlenses 1100 may be used to concentrate photons into the center of the photosensitive region. The unavoidable loss of area around the periphery of the microlens 1100 has only a negligible effect on the collection efficiency of the CMOS pixel 900.

In embodiments, the width and length of the source follower 608 driver transistor is 1.5 μm and 0.5 um, respectively.

In one embodiment, a Pwell 500 is used for the source follower 608 and row select gate, an N+ region is used for the source 202 and drain 204, and a P+ region is used for a Pwell tie. Such an embodiment requires a slight shrinkage of the pixel diffusion region to accommodate the Pwell 500, although, in embodiments, a microlens 1100 is used to focus light into the photodetector region and minimize signal loss resulting from such shrinkage.

Advantageously, embodiments of the present disclosure discussed above could also be utilized in Digital Single-Lens Reflex (DSLR) market to improve the low-light performance thereof.

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. An image sensor, the image sensor comprising:
 a plurality of pixels, wherein at least one pixel comprises:
 a photodetector configured to generate a photocurrent that varies based on the number of photons incident thereon;
 a transfer gate in operative communication with the photodetector and configured to allow a transfer of charge from the photodetector, which is generated, during use, by the impact of photons thereon;
 a floating diffusion node in operative communication with the transfer gate configured to store charge generated by the photodetector for later readout;
 a reset transistor in operative communication with the floating diffusion node configured to reset the potential of the floating diffusion node; and
 a source follower in operative communication with the floating diffusion node configured to monitor the potential of the floating diffusion node for readout by image sensor circuitry
 wherein the photodetector, transfer gate, floating diffusion node, and reset gate are pMOS, affording low dark current and correspondingly low shot noise associated with this low dark current, and the source follower is an nFET component, providing low thermal noise.

2. The image sensor of claim 1 wherein a pixel pitch of said image sensor is 5-20μm.

3. The image sensor of claim 1 wherein at least one pixel further comprises a microlens configured to focus light into a photosensitive region of said pixel, thereby minimizing signal loss.

4. The image sensor of claim 1 wherein said photodetector comprises a pinned photo diode.

5. The image sensor of claim 1 further comprising a column bus line and a row-select transistor configured to allow the contents of said nFET source follower to be read.

6. The image sensor of claim 1 further comprising an nFET pixel select switch.

7. A night vision apparatus, the night vision apparatus comprising:
 at least one display;
 at least one image sensor, said at least one image sensor further comprising a plurality of pixels;
 wherein at least one of said plurality of pixels comprises:
 a photodetector configured to generate a photocurrent that varies based on the number of photons incident thereon;
 a transfer gate in operative communication with the photodetector and configured to allow a transfer of charge from the photodetector, which is generated, during use, by the impact of photons thereon;
 a floating diffusion node in operative communication with the transfer gate configured to store charge generated by the photodetector for later readout;
 a reset transistor in operative communication with the floating diffusion node configured to reset the potential of the floating diffusion node; and a source follower in operative communication with the floating diffusion node configured to monitor the potential of the floating diffusion node for readout by image sensor circuitry wherein the photodetector, transfer gate, floating diffusion node, and reset gate are pMOS, affording low dark current and correspondingly low shot noise associated with this dark current, and the source follower is an nFET component, providing low thermal noise.

8. The night vision apparatus of claim 7 wherein a pixel pitch of said image sensor is 5-20μm.

9. The night vision apparatus of claim 7 wherein at least one pixel further comprises a microlens configured to focus light into a photosensitive region of said pixel, thereby minimizing signal loss.

10. The night vision apparatus of claim 7 wherein said photodetector comprises a pinned photo diode.

11. The night vision apparatus of claim 7 further comprising a column bus line and a row-select transistor configured to allow the contents of said source follower to be read.

12. The night vision apparatus of claim 7 further comprising an nFET pixel select switch.

13. The night vision apparatus of claim 7 further comprising a Pwell for the source follower and a row select gate, N+implants for a source drain, P+ implants, and an additional DC line for a Pwell tie.

* * * * *